(12) United States Patent
Peso Parada et al.

(10) Patent No.: US 11,515,875 B2
(45) Date of Patent: Nov. 29, 2022

(54) DEVICE COMPRISING FORCE SENSORS

(71) Applicant: Cirrus Logic International Semiconductor Ltd., Edinburgh (GB)

(72) Inventors: Pablo Peso Parada, London (GB); Tom Birchall, London (GB); Hamid Sepehr, London (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/192,632

(22) Filed: Mar. 4, 2021

(65) Prior Publication Data

US 2021/0194484 A1 Jun. 24, 2021

Related U.S. Application Data

(63) Continuation of application No. 16/369,645, filed on Mar. 29, 2019, now Pat. No. 10,992,297.

(51) Int. Cl.
*H03K 17/96* (2006.01)
*G06F 3/044* (2006.01)
*G06F 3/041* (2006.01)

(52) U.S. Cl.
CPC ......... *H03K 17/9625* (2013.01); *G06F 3/044* (2013.01); *G06F 3/04144* (2019.05); *H03K 17/962* (2013.01)

(58) Field of Classification Search
CPC ................................................ H03K 17/9625
See application file for complete search history.

(56) References Cited

U.S. PATENT DOCUMENTS

| | | | |
|---|---|---|---|
| 3,686,927 | A | 8/1972 | Scharton |
| 4,902,136 | A | 2/1990 | Mueller et al. |
| 5,684,722 | A | 11/1997 | Thorner et al. |
| 5,748,578 | A | 5/1998 | Schell |
| 5,857,986 | A | 1/1999 | Moriyasu |
| 6,050,393 | A | 4/2000 | Murai et al. |
| 6,278,790 | B1 | 8/2001 | Davis et al. |
| 6,294,891 | B1 | 9/2001 | McConnell et al. |
| 6,332,029 | B1 | 12/2001 | Azima et al. |
| 6,388,520 | B2 | 5/2002 | Wada et al. |
| 6,567,478 | B2 | 5/2003 | Oishi et al. |
| 6,580,796 | B1 | 6/2003 | Kuroki |
| 6,683,437 | B2 | 1/2004 | Tierling |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

Invitation to Pay Additional Fees, Partial International Search Report and Provisional Opinion of the International Searching Authority, International Application No. PCT/US2020/052537, dated Jan. 14, 2021.

(Continued)

*Primary Examiner* — Qutbuddin Ghulamali
(74) *Attorney, Agent, or Firm* — Jackson Walker L.L.P.

(57) ABSTRACT

A device, comprising: a pair of force sensors located for detecting a user squeeze input; and a controller operable in a squeeze detection operation to detect the user squeeze input based on a cross-correlation between respective sensor signals originating from the pair of force sensors.

19 Claims, 2 Drawing Sheets

(56) References Cited

U.S. PATENT DOCUMENTS

| | | | |
|---|---|---|---|
| 6,703,550 B2 | 3/2004 | Chu | |
| 6,762,745 B1 | 7/2004 | Braun et al. | |
| 6,768,779 B1 | 7/2004 | Nielsen | |
| 6,784,740 B1 | 8/2004 | Tabatabaei | |
| 6,906,697 B2 | 6/2005 | Rosenberg | |
| 6,995,747 B2 * | 2/2006 | Casebolt | G06F 1/3271 |
| | | | 178/18.01 |
| 7,154,470 B2 | 12/2006 | Tierling | |
| 7,277,678 B2 | 10/2007 | Rozenblit et al. | |
| 7,333,604 B2 | 2/2008 | Zernovizky et al. | |
| 7,392,066 B2 | 6/2008 | Hapamas | |
| 7,456,688 B2 | 11/2008 | Okazaki et al. | |
| 7,623,114 B2 | 11/2009 | Rank | |
| 7,639,232 B2 | 12/2009 | Grant et al. | |
| 7,791,588 B2 | 9/2010 | Tierling et al. | |
| 7,979,146 B2 | 7/2011 | Ullrich et al. | |
| 8,068,025 B2 | 11/2011 | Devenyi et al. | |
| 8,098,234 B2 | 1/2012 | Lacroix et al. | |
| 8,102,364 B2 | 1/2012 | Tierling | |
| 8,325,144 B1 | 12/2012 | Tierling et al. | |
| 8,427,286 B2 | 4/2013 | Grant et al. | |
| 8,441,444 B2 | 5/2013 | Moore et al. | |
| 8,466,778 B2 | 6/2013 | Hwang et al. | |
| 8,480,240 B2 | 7/2013 | Kashiyama | |
| 8,572,293 B2 | 10/2013 | Cruz-Hernandez et al. | |
| 8,572,296 B2 | 10/2013 | Shasha et al. | |
| 8,593,269 B2 | 11/2013 | Grant et al. | |
| 8,648,829 B2 | 2/2014 | Shahoian et al. | |
| 8,659,208 B1 | 2/2014 | Rose et al. | |
| 8,754,757 B1 | 6/2014 | Ullrich et al. | |
| 8,947,216 B2 | 2/2015 | Da Costa et al. | |
| 8,981,915 B2 | 3/2015 | Birnbaum et al. | |
| 8,994,518 B2 | 3/2015 | Gregorio et al. | |
| 9,030,428 B2 | 5/2015 | Fleming | |
| 9,063,570 B2 | 6/2015 | Weddle et al. | |
| 9,070,856 B1 | 6/2015 | Rose et al. | |
| 9,083,821 B2 | 7/2015 | Hughes | |
| 9,092,059 B2 | 7/2015 | Bhatia | |
| 9,117,347 B2 | 8/2015 | Matthews | |
| 9,128,523 B2 | 9/2015 | Buuck et al. | |
| 9,164,587 B2 | 10/2015 | Da Costa et al. | |
| 9,196,135 B2 | 11/2015 | Shah et al. | |
| 9,248,840 B2 | 2/2016 | Truong | |
| 9,326,066 B2 | 4/2016 | Klppel | |
| 9,329,721 B1 | 5/2016 | Buuck et al. | |
| 9,354,704 B2 | 5/2016 | Lacroix et al. | |
| 9,368,005 B2 | 6/2016 | Cruz-Hernandez et al. | |
| 9,489,047 B2 | 11/2016 | Jiang et al. | |
| 9,495,013 B2 | 11/2016 | Underkoffler et al. | |
| 9,507,423 B2 | 11/2016 | Gandhi et al. | |
| 9,513,709 B2 | 12/2016 | Gregorio et al. | |
| 9,520,036 B1 | 12/2016 | Buuck | |
| 9,588,586 B2 | 3/2017 | Rihn | |
| 9,640,047 B2 | 5/2017 | Choi et al. | |
| 9,652,041 B2 | 5/2017 | Jiang et al. | |
| 9,696,859 B1 | 7/2017 | Heller et al. | |
| 9,697,450 B1 | 7/2017 | Lee | |
| 9,715,300 B2 | 7/2017 | Sinclair et al. | |
| 9,740,381 B1 | 8/2017 | Chaudhri et al. | |
| 9,842,476 B2 | 12/2017 | Rihn et al. | |
| 9,864,567 B2 | 1/2018 | Seo | |
| 9,881,467 B2 | 1/2018 | Levesque | |
| 9,886,829 B2 | 2/2018 | Levesque | |
| 9,946,348 B2 | 4/2018 | Ullrich et al. | |
| 9,947,186 B2 | 4/2018 | Macours | |
| 9,959,744 B2 | 5/2018 | Koskan et al. | |
| 9,965,092 B2 | 5/2018 | Smith | |
| 10,032,550 B1 | 7/2018 | Zhang et al. | |
| 10,055,950 B2 | 8/2018 | Saboune et al. | |
| 10,074,246 B2 | 9/2018 | Da Costa et al. | |
| 10,110,152 B1 | 10/2018 | Hajati | |
| 10,171,008 B2 | 1/2019 | Nishitani et al. | |
| 10,175,763 B2 | 1/2019 | Shah | |
| 10,191,579 B2 | 1/2019 | Forlines et al. | |
| 10,264,348 B1 | 4/2019 | Harris et al. | |
| 10,275,087 B1 | 4/2019 | Smith | |
| 10,402,031 B2 | 9/2019 | Vandermeijden et al. | |
| 10,564,727 B2 * | 2/2020 | Billington | B06B 1/045 |
| 10,620,704 B2 | 4/2020 | Rand et al. | |
| 10,667,051 B2 | 5/2020 | Stahl | |
| 10,726,683 B1 | 7/2020 | Mondello et al. | |
| 10,735,956 B2 | 8/2020 | Bae et al. | |
| 10,782,785 B2 | 9/2020 | Hu et al. | |
| 10,795,443 B2 | 10/2020 | Hu et al. | |
| 10,820,100 B2 | 10/2020 | Stahl et al. | |
| 10,828,672 B2 | 11/2020 | Stahl et al. | |
| 10,832,537 B2 | 11/2020 | Doy et al. | |
| 10,848,886 B2 | 11/2020 | Rand | |
| 10,860,202 B2 | 12/2020 | Sepehr et al. | |
| 10,969,871 B2 | 4/2021 | Rand et al. | |
| 11,069,206 B2 | 7/2021 | Rao et al. | |
| 11,139,767 B2 | 10/2021 | Janko et al. | |
| 11,150,733 B2 | 10/2021 | Das et al. | |
| 11,259,121 B2 | 2/2022 | Lindemann | |
| 2001/0043714 A1 | 11/2001 | Asada et al. | |
| 2002/0018578 A1 | 2/2002 | Burton | |
| 2002/0085647 A1 | 7/2002 | Oishi et al. | |
| 2002/0169608 A1 | 11/2002 | Tamir et al. | |
| 2003/0068053 A1 | 4/2003 | Chu | |
| 2003/0214485 A1 | 11/2003 | Roberts | |
| 2005/0031140 A1 | 2/2005 | Browning | |
| 2005/0134562 A1 | 6/2005 | Grant et al. | |
| 2006/0028095 A1 | 2/2006 | Maruyama et al. | |
| 2006/0197753 A1 | 9/2006 | Hotelling | |
| 2007/0024254 A1 | 2/2007 | Radecker et al. | |
| 2007/0241816 A1 | 10/2007 | Okazaki et al. | |
| 2008/0077367 A1 | 3/2008 | Odajima | |
| 2008/0226109 A1 | 9/2008 | Yamakata et al. | |
| 2008/0240458 A1 | 10/2008 | Goldstein et al. | |
| 2008/0293453 A1 | 11/2008 | Atlas et al. | |
| 2008/0316181 A1 | 12/2008 | Nurmi | |
| 2009/0020343 A1 | 1/2009 | Rothkopf et al. | |
| 2009/0079690 A1 | 3/2009 | Watson et al. | |
| 2009/0088220 A1 | 4/2009 | Persson | |
| 2009/0096632 A1 | 4/2009 | Ullrich et al. | |
| 2009/0102805 A1 | 4/2009 | Meijer et al. | |
| 2009/0128306 A1 | 5/2009 | Luden et al. | |
| 2009/0153499 A1 | 6/2009 | Kim et al. | |
| 2009/0189867 A1 | 7/2009 | Krah et al. | |
| 2009/0278819 A1 | 11/2009 | Goldenberg et al. | |
| 2009/0313542 A1 | 12/2009 | Cruz-Hernandez et al. | |
| 2010/0013761 A1 | 1/2010 | Birnbaum et al. | |
| 2010/0080331 A1 | 4/2010 | Garudadr et al. | |
| 2010/0085317 A1 | 4/2010 | Park et al. | |
| 2010/0141408 A1 | 6/2010 | Doy et al. | |
| 2010/0141606 A1 | 6/2010 | Bae et al. | |
| 2010/0260371 A1 | 10/2010 | Afshar | |
| 2010/0261526 A1 | 10/2010 | Anderson et al. | |
| 2011/0056763 A1 | 3/2011 | Tanase et al. | |
| 2011/0075835 A1 | 3/2011 | Hill | |
| 2011/0077055 A1 | 3/2011 | Pakula et al. | |
| 2011/0141052 A1 | 6/2011 | Bernstein et al. | |
| 2011/0161537 A1 | 6/2011 | Chang | |
| 2011/0163985 A1 | 7/2011 | Bae et al. | |
| 2011/0167391 A1 | 7/2011 | Momeyer et al. | |
| 2012/0011436 A1 | 1/2012 | Jinkinson et al. | |
| 2012/0105358 A1 | 5/2012 | Momeyer et al. | |
| 2012/0112894 A1 | 5/2012 | Yang et al. | |
| 2012/0206246 A1 | 8/2012 | Cruz-Hernandez et al. | |
| 2012/0206247 A1 | 8/2012 | Bhatia et al. | |
| 2012/0229264 A1 | 9/2012 | Company Bosch et al. | |
| 2012/0253698 A1 | 10/2012 | Cokonaj | |
| 2012/0306631 A1 | 12/2012 | Hughes | |
| 2013/0016855 A1 | 1/2013 | Lee et al. | |
| 2013/0027359 A1 | 1/2013 | Schevin et al. | |
| 2013/0038792 A1 | 2/2013 | Quigley et al. | |
| 2013/0096849 A1 | 4/2013 | Campbell et al. | |
| 2013/0132091 A1 | 5/2013 | Skerpac | |
| 2013/0141382 A1 | 6/2013 | Simmons et al. | |
| 2013/0275058 A1 * | 10/2013 | Awad | G01L 1/242 |
| | | | 702/42 |
| 2013/0289994 A1 | 10/2013 | Newman et al. | |
| 2014/0056461 A1 | 2/2014 | Afshar | |
| 2014/0064516 A1 | 3/2014 | Cruz-Hernandez et al. | |

(56) References Cited

U.S. PATENT DOCUMENTS

| | | |
|---|---|---|
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0139327 A1* | 5/2014 | Bau .................. G06F 3/016 340/407.1 |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2014/0347176 A1 | 11/2014 | Modarres et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0084752 A1 | 3/2015 | Heubel et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1* | 3/2016 | Wang ................ H03K 17/9643 345/173 |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0162031 A1 | 6/2016 | Westerman et al. |
| 2016/0179203 A1* | 6/2016 | Modarres ................ G08B 6/00 340/407.1 |
| 2016/0187987 A1 | 6/2016 | Ulrich et al. |
| 2016/0239089 A1 | 8/2016 | Taninaka et al. |
| 2016/0246378 A1 | 8/2016 | Sampanes et al. |
| 2016/0248768 A1 | 8/2016 | McLaren et al. |
| 2016/0277821 A1 | 9/2016 | Kunimoto |
| 2016/0291731 A1 | 10/2016 | Liu et al. |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1* | 3/2017 | Rihn .................. G06F 3/04883 |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0224963 A1 | 8/2018 | Lee et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0043512 A1 | 2/2019 | Huang et al. |
| 2019/0044651 A1 | 2/2019 | Nakada |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1* | 3/2019 | Sheng .................. H01L 41/319 |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0287536 A1 | 9/2019 | Sharifi et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2020/0117506 A1* | 4/2020 | Chan .................. G06F 9/50 |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0313529 A1 | 10/2020 | Lindemann |
| 2020/0313654 A1 | 10/2020 | Marchais et al. |
| 2020/0314969 A1 | 10/2020 | Marchais et al. |
| 2020/0403546 A1 | 12/2020 | Janko et al. |
| 2021/0108975 A1 | 4/2021 | Peso Parada et al. |
| 2021/0125469 A1 | 4/2021 | Alderson |
| 2021/0153562 A1 | 5/2021 | Fishwick et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |
| 2022/0026989 A1 | 1/2022 | Rao et al. |

FOREIGN PATENT DOCUMENTS

| | | |
|---|---|---|
| CN | 204903757 U | 12/2015 |
| CN | 105264551 A | 1/2016 |
| CN | 106438890 A | 2/2017 |
| CN | 103403796 A | 7/2017 |
| CN | 106950832 A | 7/2017 |
| CN | 107665051 A | 2/2018 |
| CN | 210628147 U | 5/2020 |
| CN | 114237414 A | 3/2022 |
| EP | 0784844 B1 | 6/2005 |
| EP | 2306269 A1 | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |

(56) References Cited

FOREIGN PATENT DOCUMENTS

| | | |
|---|---|---|
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 0208147 A1 | 10/2002 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2020/052537, dated Mar. 9, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Final Notice of Preliminary Rejection, Korean Patent Office, Application No. 10-2019-7036236, dated Nov. 29, 2021.
Examination Report, United Kingdom Intellectual Property Office, Application No. GB2018051.9, dated Nov. 5, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.

Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, dated Jul. 5, 2021.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/GB2019/052991, dated Mar. 17, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/GB2020/051037, dated Jul. 9, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/US2020/056610, dated Jan. 21, 2021.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
Examination Report under Section 18(3), United Kingdom Intellectual Property Office, Application No. GB2106247.6, dated Mar. 31, 2022.
Combined Search and Examination Report under Sections 17 and 18(3), UKIPO, Application No. GB2112228.8, dated May 17, 2022.
Search Report under Section 17, UKIPO, Application No. GB2202521.7, dated Jun. 21, 2022.
Combined Search and Examination Report under Sections 17 and 18(3), UKIPO, Application No. GB2210174.5, dated Aug. 1, 2022.
Examination Report under Sections 17 and 18(3), UKIPO, Application No. GB2112207.2, dated Aug. 18, 2022.
International Search Report and Written Opinion of the International Searching Authority, International Application No. PCT/US2022/030541, dated Sep. 1, 2022.
Vanderborght, B. et al., Variable impedance actuators: A review; Robotics and Autonomous Systems 61, Aug. 6, 2013, pp. 1601-1614.

(56) References Cited

OTHER PUBLICATIONS

International Search Report and Written Opinion of the International Searching Authority, International Application No. PCT/US2022/033190, dated Sep. 8, 2022.
International Search Report and Written Opinion of the International Searching Authority, International Application No. PCT/US2022/033230, dated Sep. 15, 2022.

* cited by examiner

DEVICE COMPRISING FORCE SENSORS

The present disclosure is a continuation of U.S. Non-Provisional patent application Ser. No. 16/369,645, filed Mar. 29, 2019, which is incorporated by reference herein in its entirety.

FIELD OF DISCLOSURE

The present disclosure relates in general to a device comprising force sensors. Such a device may be a portable electrical or electronic device.

The present disclosure extends to a controller of the device and to corresponding methods and computer programs.

BACKGROUND

Force sensors are known as possible input transducers for devices such as portable electrical or electronic devices, and can be used as alternatives to traditional mechanical switches. Such sensors detect forces on the device to determine user interaction, e.g. touches or presses of the device (user force inputs).

It is desirable to process the sensor signals originating from such force sensors in a convenient and useful manner.

SUMMARY

According to a first aspect of the present disclosure, there is provided a device, comprising: a pair of force sensors located for detecting a user squeeze input; and a controller operable in a squeeze detection operation to detect the user squeeze input based on a cross-correlation between respective sensor signals originating from the pair of force sensors.

The device may be a portable electrical or electronic device such as a portable telephone or computer. Other example devices are mentioned later herein. Using cross-correlation as disclosed herein provides a robust way of detecting a user squeeze input.

The user squeeze input may comprise a user applying forces: with one or both of their hands; and/or which together compress the device; and/or at at least two different locations on the device at the same time; and/or on at least two different sides or edges of the device at the same time; and/or on at least two opposite or opposing sides or edges of the device at the same time.

The pair of force sensors may be provided: at different locations on the device; and/or on the same side or edge of the device, or on different sides or edges of the device, or on opposite or opposing sides or edges of the device; and/or on the device at locations according to anthropometric measurements of a human hand.

The squeeze detection operation may comprise determining a cross-correlation value based on the sensor signals and detecting the user squeeze input based on the cross-correlation value. Determining the cross-correlation value may comprise determining a sliding dot product, a cross-product, a product, a sum or a combination of the sensor signals originating from the pair of force sensors.

The respective sensor signals originating from the pair of force sensors may be digital signals. The squeeze detection operation may comprise determining the cross-correlation value on a sample-by-sample basis.

For a given sample, the cross-correlation value may be generated as an updated cross-correlation value by updating an existing cross-correlation value (which was the updated cross-correlation value for the previous sample) based on a new cross-correlation value determined based on the sensor signals for that sample. The updated cross-correlation value may be based on the existing cross-correlation value to an extent defined by a smoothing parameter. The updated cross-correlation value may be based on a combination or sum of a proportion (e.g. 90%) of the existing cross-correlation value and a proportion (e.g. 10%) of the new cross-correlation value, those proportions defined by the smoothing parameter. The cross-correlation value may be generated as a smoothed cross-product of the respective sensor signals originating from the pair of force sensors.

The squeeze detection operation may comprise: at least one of normalising, filtering and bounding the cross-correlation value; and/or normalising the cross-correlation value to a maximum expected force value (i.e. to a value representative of a maximum expected force applied to a force sensor); and/or converting the cross-correlation value into a percentage or a fraction of a defined maximum value (e.g. 1 or 100); and/or comparing the cross-correlation value with a threshold value (e.g. a squeeze threshold, above which it is determined that a user squeeze input has occurred).

The squeeze detection operation may comprise determining whether the cross-correlation value exceeds the threshold value. The threshold value may be controlled based on one or more of a device configuration, a device setting and a user input.

The squeeze detection operation may comprise determining whether the cross-correlation value exceeds the threshold value for a threshold period of time, or by a threshold percentage of the threshold period of time. Thus, it may be that it is not sufficient for the cross-correlation value to exceed the threshold value only briefly. The threshold period and/or the threshold percentage may be controlled based on one or more of a device configuration, a device setting and a user input.

The device may comprise plurality of pairs of force sensors, each pair located for detecting a corresponding user squeeze input. The controller may be operable, for each pair of force sensors, to carry out a said squeeze detection operation to detect the corresponding user squeeze input.

The device may comprise at least two said pairs of force sensors located on the device for detecting the same user squeeze input. The controller may be operable to detect the user squeeze input corresponding to those pairs of force sensors based on a combination of the squeeze detection operations carried out for those pairs, optionally by combining cross-correlation values determined in respect of each of those pairs.

At least one said pair of force sensors may be part of a group of force sensors located on the device for detecting a user squeeze input corresponding to that group. The squeeze detection operation, for that group, may comprise comparing respective sensor signals originating from at least three of the force sensors of the group.

The group may comprise force sensors s1, s2, s3 and s4. The sensor signals originating from the group may be digital signals s1(n), s2(n), s3(n) and s4(n) corresponding respectively to the force sensors s1, s2, s3 and s4 and each comprising a series of numbered samples, where n is the sample number. The squeeze detection operation for the group may comprise calculating correlation coefficients $\rho_1(n)$ and $\rho_2(n)$ based on the equations:

$$\rho_1(n) = \lambda \cdot \rho_1(n-1) + (1-\lambda) \cdot s1(n) \cdot s2(n)$$

$$\rho_2(n) = \lambda \cdot \rho_2(n-1) + (1-\lambda) \cdot s3(n) \cdot s4(n)$$

where $\lambda$ is a smoothing parameter.

The squeeze detection operation for that group may comprise normalising the correlation coefficients $\rho_1(n)$ and $\rho_2(n)$ to produce respective normalised correlation coefficients based on the equations:

$$\tilde{\rho}_1(n) = \frac{\min(\max(\rho_1(n), 0), \gamma)}{\gamma}$$

$$\tilde{\rho}_2(n) = \frac{\min(\max(\rho_2(n), 0), \gamma)}{\gamma}$$

where $\gamma$ is a parameter representing a maximum expected squared force.

The squeeze detection operation for the group may comprise determining a squeeze force level signal y(n) based on the equation:

$$y(n) = \min(\tilde{\rho}_1(n) + \tilde{\rho}_2(n), 1).$$

The squeeze detection operation for the group may comprise detecting the user squeeze input based on the squeeze force level signal y(n).

The controller may be configured to control operation of the device based on detection of the user squeeze input, optionally by outputting a control signal based on detection of the user squeeze input. The device may comprise one or more input/output components, wherein the controller is configured to control operation of at least one of the input/output components based on detection of the user squeeze input.

Each of the force sensors may comprise one or more of: a capacitive displacement sensor; an inductive force sensor; a strain gauge; a piezoelectric force sensor; a force sensing resistor; a piezoresistive force sensor; a thin film force sensor; and a quantum tunneling composite-based force sensor.

According to a second aspect of the present disclosure, there is provided a controller for use in a device comprising a pair of force sensors located for detecting a user squeeze input, the controller operable in a squeeze detection operation to detect the user squeeze input based on a cross-correlation between respective sensor signals originating from the pair of force sensors.

According to a third aspect of the present disclosure, there is provided a method of detecting a user squeeze input in a device comprising a pair of force sensors located for detecting the user squeeze input, the method comprising detecting the user squeeze input based on a cross-correlation between respective sensor signals originating from the pair of force sensors.

According to a fourth aspect of the present disclosure, there is provided a computer program which, when executed by a controller of a device comprising a pair of force sensors located for detecting a user squeeze input, causes the controller to carry out a squeeze detection operation to detect the user squeeze input based on a cross-correlation between respective sensor signals originating from the pair of force sensors.

According to a fifth aspect of the present disclosure, there is provided a device, comprising: a pair of force sensors located for detecting a user force input; and a controller operable in a detection operation to detect the user force input based on a cross-correlation between respective sensor signals originating from the pair of force sensors.

BRIEF DESCRIPTION OF THE DRAWINGS

Reference will now be made, by way of example only, to the accompanying drawings, of which.

DETAILED DESCRIPTION

Figure 1:
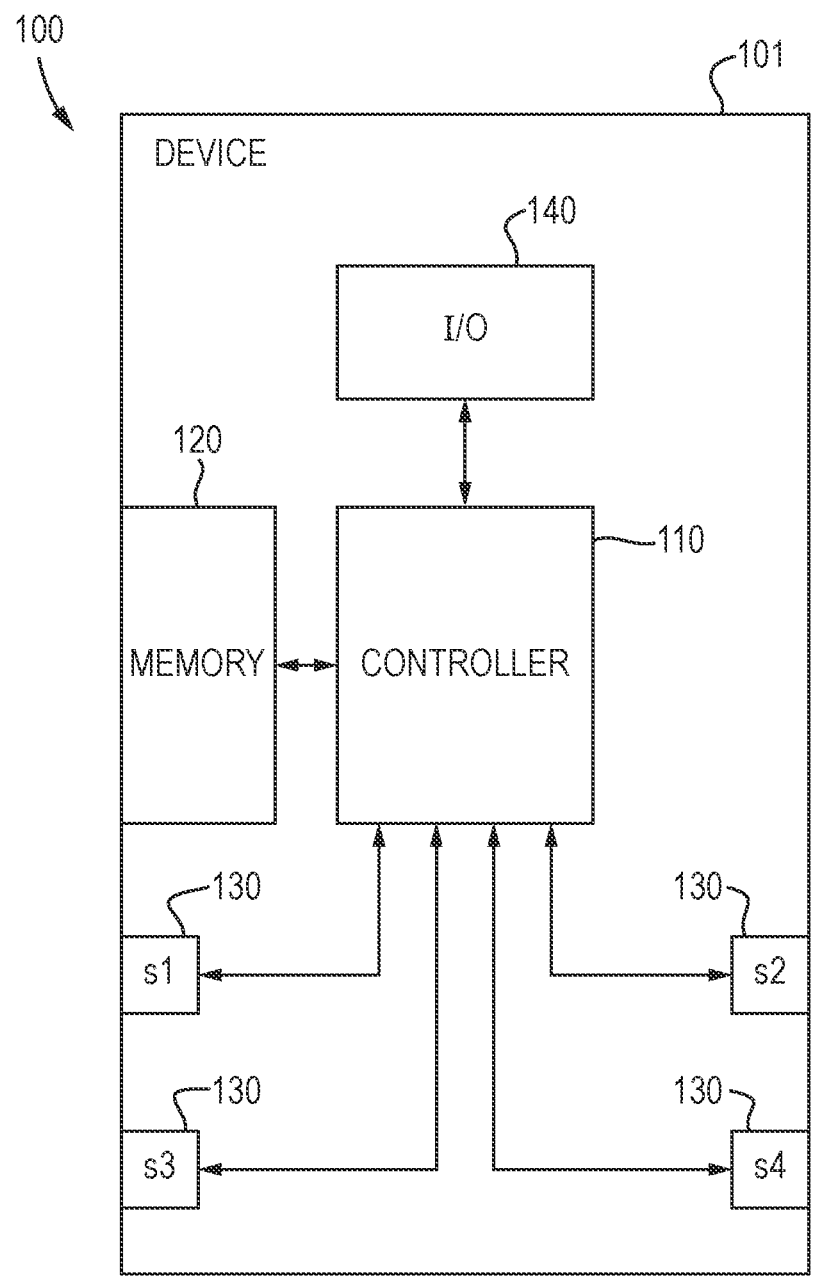
FIG. 1 is a schematic diagram of a device according to an embodiment.

FIG. 1 is a schematic diagram of a device 100 according to an embodiment, for example a mobile or portable electrical or electronic device. Example device 100 includes a portable and/or battery powered host device such as a mobile telephone, a smartphone, an audio player, a video player, a PDA, a mobile computing platform such as a laptop computer or tablet and/or a games device.

As shown in FIG. 1, the device 100 may comprise an enclosure 101, a controller 110, a memory 120, a plurality of force sensors 130, and an input and/or output unit (I/O unit) 140.

The enclosure 101 may comprise any suitable housing, casing, or other enclosure for housing the various components of device 100. Enclosure 101 may be constructed from plastic, metal, and/or any other suitable materials. In addition, enclosure 101 may be adapted (e.g., sized and shaped) such that device 100 is readily transported by a user (i.e. a person).

Controller 110 may be housed within enclosure 101 and may include any system, device, or apparatus configured to control functionality of the device 100, including any or all of the memory 120, the force sensors 130, and the I/O unit 140. Controller 110 may be implemented as digital or analogue circuitry, in hardware or in software running on a processor, or in any combination of these.

Thus controller 110 may include any system, device, or apparatus configured to interpret and/or execute program instructions or code and/or process data, and may include, without limitation a processor, microprocessor, microcontroller, digital signal processor (DSP), application specific integrated circuit (ASIC), FPGA (Field Programmable Gate Array) or any other digital or analogue circuitry configured to interpret and/or execute program instructions and/or process data. Thus the code may comprise program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware. Processor control code for execution by the controller 110, may be provided on a non-volatile carrier medium such as a disk, CD- or DVD-ROM, programmed memory such as read only memory (Firmware), or on a data carrier such as an optical or electrical signal carrier. The controller 110 may be referred to as control circuitry and may be provided as, or as part of, an integrated circuit such as an IC chip.

Memory 120 may be housed within enclosure 101, and may be communicatively coupled to controller 110, and may include any system, device, or apparatus configured to retain program instructions and/or data for a period of time (e.g., computer-readable media). In some embodiments, controller 110 interprets and/or executes program instructions and/or processes data stored in memory 120 and/or other computer-readable media accessible to controller 110.

The force sensors 130 may be housed within, be located on or form part of the enclosure 101, and may be communicatively coupled to the controller 110. Each force sensor 130 may include any suitable system, device, or apparatus for sensing a force, a pressure, or a touch (e.g., an interaction with a human finger) and for generating an electrical or electronic signal in response to such force, pressure, or touch. Example force sensors 130 include or comprise capacitive displacement sensors, inductive force sensors, strain gauges, piezoelectric force sensors, force sensing resistors, piezoresistive force sensors, thin film force sensors and quantum tunneling composite-based force sensors.

In some arrangements, the electrical or electronic signal generated by a force sensor 130 may be a function of a magnitude of the force, pressure, or touch applied to the force sensor (a user force input). Such electronic or electrical signal may comprise a general purpose input/output (GPIO) signal associated with an input signal in response to which the controller 110 controls some functionality of the device 100. The term "force" as used herein may refer not only to force, but to physical quantities indicative of force or analogous to force such as, but not limited to, pressure and touch.

The I/O unit 140 may be housed within enclosure 101, may be distributed across the device 100 (i.e. it may represent a plurality of units) and may be communicatively coupled to the controller 110. Although not specifically shown in FIG. 1, the I/O unit 140 may comprise any or all of a microphone, an LRA (or other device capable of outputting a force, such as a vibration), a radio (or other electromagnetic) transmitter/receiver, a speaker, a display screen (optionally a touchscreen), an indicator (such as an LED), a sensor (e.g. accelerometer, temperature sensor, tilt sensor, electronic compass, etc.) and one or more buttons or keys.

As a convenient example to keep in mind, the device 100 may be a haptic-enabled device. As is well known, haptic technology recreates the sense of touch by applying forces, vibrations, or motions to a user. The device 100 for example may be considered a haptic-enabled device (a device enabled with haptic technology) where its force sensors 130 (input transducers) measure forces exerted by the user on a user interface (such as a button or touchscreen on a mobile telephone or tablet computer), and an LRA or other output transducer of the I/O unit 140 applies forces directly or indirectly (e.g. via a touchscreen) to the user, e.g. to give haptic feedback. Some aspects of the present disclosure, for example the controller 110 and/or the force sensors 130, may be arranged as part of a haptic circuit, for instance a haptic circuit which may be provided in the device 100. A circuit or circuitry embodying aspects of the present disclosure (such as the controller 110) may be implemented (at least in part) as an integrated circuit (IC), for example on an IC chip. One or more input or output transducers (such as the force sensors 130 or an LRA) may be connected to the integrated circuit in use.

Of course, this application to haptic technology is just one example application of the device 100 comprising the plurality of force sensors 130. The force sensors 130 may simply serve as generic input transducers to provide input signals to control other aspects of the device 100, such as a GUI (graphical user interface) displayed on a touchscreen of the I/O unit 140 or an operational state of the device 100 (such as waking components from a low-power "sleep" state).

The device 100 is shown comprising four force sensors 130, labelled s1, s2, s3 and s4, with their signals labelled S1, S2, S3 and S4, respectively. However, it will be understood that the device 100 generally need only comprise a pair of (i.e. at least two) force sensors 130 in connection with the techniques described herein, for example any pair of the sensors s1 to s4. Example pairs comprise s1 and s2, s1 and s3, s1 and s4, s2 and s4, s2 and s3, and s3 and s4. The four force sensors 130 s1 to s4 are shown for ready understanding of a particular arrangement described later. Of course, the device 100 may comprise more than four force sensors 130, such as additional sensors s5 to s8 arranged in a similar way to sensors s1 to s4 but in another area of the device 100.

Although FIG. 1 is schematic, it will be understood that the sensors s1 to s4 are located so that they can receive force inputs from a user, in particular a user hand, during use of the device 100. A user force input in this context corresponds to a user touching, pushing, pressing, or swiping the device, optionally with one or both of their hands, in the vicinity of one or more of the force sensors 130 so that a force (e.g. a threshold amount of force) may be applied at multiple force sensors at or substantially at the same time (simultaneously or contemporaneously) in some cases. Of course, in some cases the user may apply a user force input at a single force sensor 130. A change in the amount of force applied may be detected, rather than an absolute amount of force detected, for example.

Thus, the force sensors s1 to s4 may be located on the device according to anthropometric measurements of a human hand (e.g. so that a single human hand will likely apply a force to multiple force sensors when squeezing the device 100). For example, where there is only a pair of force sensors 130, they may be provided on the same side (e.g. s1 and s3), or on opposite sides (e.g. s1 and s2), of the device 100. It will be understood that the force sensors 130 are provided at different locations on the device, but may be in close proximity to one another.

In overview, taking a pair of force sensors 130 as a minimum case, the controller 110 is operable to perform a squeeze detection operation to detect a user squeeze input, the squeeze detection operation being a function of sensor signals originating from the respective force sensors 130 of the pair.

In this context, a user squeeze input comprises a user applying forces (e.g. with one or both of their hands) which together compress the device. Such forces may be applied at at least two different locations on the device at the same time, such as on at least two different sides or edges of the device. For example, such forces may be applied on at least two opposite or opposing sides or edges of the device at the same time. With the force sensors at different locations on the device (on the same side or edge of the device, or on different sides or edges of the device as mentioned earlier) such a user squeeze input may be picked up.

The squeeze detection operation involves operating on both of the sensor signals originating from the pair of force sensors 130, where each of them has its own sensor signal. The squeeze detection operation may be considered to comprise a comparison of the sensor signals originating from the pair of force sensors 130, where each of them has its own sensor signal. The controller 110 is thus connected to receive sensor signals, in digital or analogue form, originating from the force sensors 130.

The squeeze detection operation (e.g. the comparison of the sensor signals) may comprise determining a detection value based on the sensor signals, in particular a cross-correlation value as described in more detail later.

Figure 2:
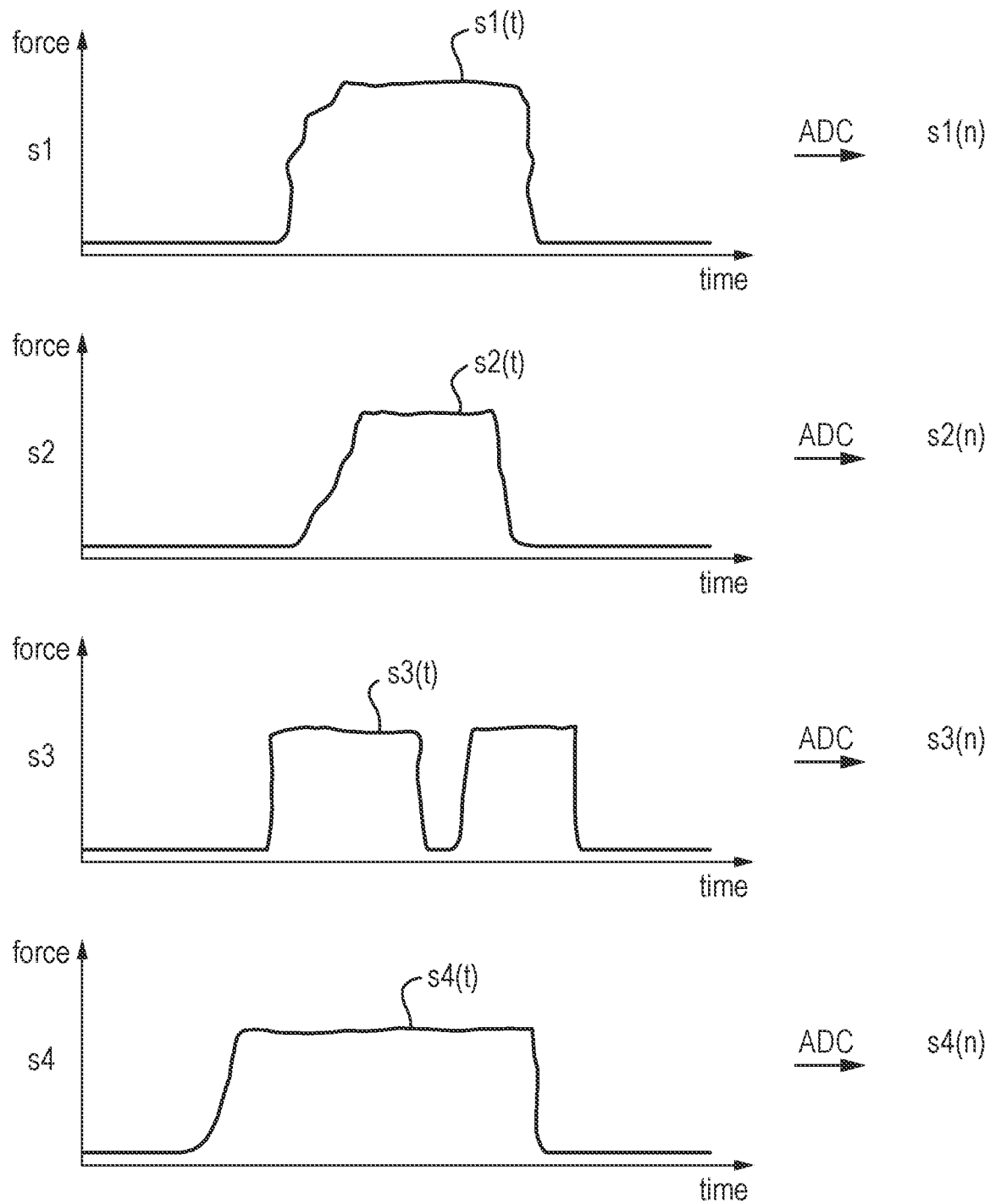
FIG. 2 presents example graphs of sensor signals which may be received from the force sensors of the FIG. 1 device.

FIG. 2 presents example graphs of analogue (time domain) signals s1(t), s2(t), s3(t) and s4(t), which may be received from the force sensors s1, s2, s3 and s4, respectively, based on an example user squeeze applied to the device 100 by a user hand. In each graph, the x-axis represents time (e.g. measured in seconds, or milliseconds), and the y-axis represents force (e.g. measured in Newtons). It will be appreciated that the analogue signals may be voltage signals, in which case the y-axis unit may be volts (e.g. millivolts) but still be representative of detected force.

Also shown in FIG. 2 in schematic form alongside each of the graphs is an analogue-to-digital conversion of the each of the analogue (time domain) signals s1(t), s2(t), s3(t) and s4(t) to corresponding digital (digital domain) signals s1(n), s2(n), s3(n) and s4(n), respectively. The analogue-to-digital conversion could be carried out by corresponding analogue-to-digital converters (ADCs, not shown), which could be provided within the force sensors 130, within the controller 110, or between the force sensors 130 and the controller 110. The force sensors 130 could be digital force sensors which output digital signals s1(n), s2(n), s3(n) and s4(n) directly.

It will be apparent from FIG. 2 that by considering the sensor signals from at least a pair of the force sensors 130 it may be possible to detect a user squeeze input, i.e. a user squeezing the device so that a force is applied at multiple force sensors at the same time (simultaneously or contemporaneously).

There are several ways to consider the sensor signals from at least a pair of the force sensors 130. Taking the minimum case of considering the sensor signals from (only) a pair of the force sensors 130, the detection value may comprise or be a correlation value (cross-correlation value), determined by calculating a correlation between the sensor signals.

In some arrangements where the sensor signals are digital signals, the cross-correlation value is calculated as a cross-product of the sensor signals concerned (i.e. of their magnitudes) on a sample-by-sample basis. Smoothing of the cross-correlation values may be carried out. For example, for a given sample, the cross-correlation value may be generated as an updated cross-correlation value by updating an existing cross-correlation value based on a new cross-correlation value determined based on the sensor signals for that sample. In some arrangements, the updated cross-correlation value is based on the existing cross-correlation value to an extent defined by a smoothing parameter, or is based on a combination (e.g. sum) of a proportion of the existing cross-correlation value and a proportion of the new cross-correlation value, those proportions defined by the smoothing parameter. Those proportions may for example sum to 1 (100%), e.g. being 0.9 (90%) and 0.1 (10%), or 0.7 (70%) and 0.3 (30%). In this respect, the cross-correlation value may be considered a smoothed cross-product of the respective sensor signals originating from the pair of force sensors. Other examples of smoothing may include taking a running average (e.g. of a given number of cross-correlation values) such as a sliding window average (with a given or adaptable window size), or low-pass filtering.

The detection value may comprise a summation value, determined by summing the sensor signals. As another example, the detection value may comprise a difference value, determined by calculating a difference between the sensor signals. As another example, the detection value may comprise a multiplication value, determined by multiplying the sensor signals one by the other. As another example, the detection value may comprise a division value, determined by dividing the sensor signals one by the other. As another example, the detection value may comprise a convolution value, determined by convolving the sensor signals one with the other. Of course, combinations of these values may be used in the squeeze detection operation.

It will be appreciated that the sensor signals or the detection values (in particular, cross-correlation values) may be subject to conversion (e.g. analogue-to-digital), normalisation, filtering (e.g. high-pass, low-pass or band-pass frequency filtering), averaging (e.g. finding a running average) or other signal conditioning operations. The detection values may for example be normalised to a maximum expected force value, and then converted to a percentage (or a fraction of a defined maximum value). The detection values may for example be bounded, between given maximum and minimum boundary values such as 0 and 1.

In some arrangements, the squeeze detection operation compares the detection value with a threshold value. For example, the squeeze detection operation may determine whether the detection value exceeds the threshold value. The controller 110 may be configured to control the threshold value based on one or more of a device configuration, a device setting and a user input.

The squeeze detection operation may involve determining whether the detection value exceeds the threshold value for a threshold period of time, or exceeds the threshold value over a threshold percentage of a threshold period of time. The controller 110 may be configured to control the threshold period and/or the threshold percentage based on one or more of a device configuration, a device setting and a user input.

As in FIG. 1, the device 100 may comprise a plurality of pairs of force sensors 130. For example, the device 100 is shown as having two pairs of force sensors 130, e.g. s1 and s2 as one pair, and s3 and s4 as another pair. Each of these pairs may be considered located for detecting a corresponding (different) user squeeze input. The controller 110 may be operable, for each pair of force sensors 130 (i.e. on a pair-by-pair basis), to carry out a squeeze detection operation to detect the corresponding user squeeze input. Those operations may be carried out at least in part in parallel or in series (sequentially).

Where there are at least two pairs of force sensors 130, as in FIG. 1, those pairs may be located on the device 100 for detecting the same user squeeze input. The controller 110 may be operable to detect the user squeeze input corresponding to those pairs of force sensors 130 based on a combination of the squeeze detection operations carried out for those pairs. For example, the controller 110 may combine detection values for the two detection operations in some way (e.g. take an average), for example after normalisation or bounding.

Where there are more than two force sensors 130, as in FIG. 1, those force sensors may be considered to form a group of force sensors 130 (the group comprising a pair of force sensors 130) located on the device 100 for detecting a user squeeze input corresponding to that group. The squeeze detection operation, for that group, may be a function (comprising a comparison) of the respective sensor signals originating from at least three of the force sensors 130 of the group.

As a detailed example based on FIG. 1, the group may be considered to comprise the force sensors 130 s1, s2, s3 and s4. In line with FIG. 2, it may be considered that the sensor signals originating from the group are digital signals s1(n), s2(n), s3(n) and s4(n), corresponding respectively to the force sensors s1, s2, s3 and s4 and each comprising a series of numbered samples, where n is the sample number.

In that case, the squeeze detection operation for the group may comprise calculating correlation (cross-correlation) coefficients $\rho_1(n)$ and $\rho_2(n)$ as example cross-correlation values based on the equations:

$$\rho_1(n) = \lambda \cdot \rho_1(n-1) + (1-\lambda) \cdot s1(n) \cdot s2(n)$$

$$\rho_2(n) = \lambda \cdot \rho_2(n-1) + (1-\lambda) \cdot s3(n) \cdot s4(n)$$

where $\lambda$ is a smoothing (weighting or learning rate) parameter. Here, the correlation coefficients $\rho_1(n)$ and $\rho_2(n)$ could be considered updated correlation coefficients and are based at least in part on previous or existing correlation coefficients $\rho_1(n-1)$ and $\rho_2(n-1)$ and newly-calculated coefficients (i.e. based on the current samples) s1(n)·s2(n) and s3(n)·s4(n), to an extent defined by the smoothing parameter. It can readily be seen above that the smoothing parameter A determines the relative proportions of the existing and new coefficients that make up the updated coefficients. For example if $\lambda$ is 0.9 then in the above equations an updated coefficient will be the sum of 90% of the existing coefficient and 10% of the new coefficient concerned.

Thus, the above equations may be considered to calculate smoothed cross-products. Other methods of smoothing include averaging (e.g. calculating a running average or sliding window average or time-based or multiple-sample-based average) and low-pass filtering. Of course, it may be that only one of the correlation coefficients $\rho_1(n)$ and $\rho_2(n)$ is calculated, e.g. where only two force sensors are employed, however the present example where both are calculated will be continued.

The above equations for the correlation coefficients $\rho_1(n)$ and $\rho_2(n)$ may be considered a simplification of more general cross-correlation equations which take account of a potentially variable window size w and hardware delay $\Delta$ (e.g. a relative delay between the signals provided by the force sensors 130), the above simplification using w=1 and $\Delta=0$.

Such a more general cross-correlation equation is indicated below for the correlation coefficient $\rho 1(n)$, where i is the sensor index:

$$\rho_i(n) = \lambda \rho_i(n-1) + (1-\lambda) s_1(n-\Delta) s_2^T(n)$$

$$s_i(n) = [s_i(n-w+1), s_i(n-w+2), \ldots, s_i(n)]$$

It will be appreciated that there may be a hardware delay between the force sensors 130, and it may be desirable in some applications to use a larger window size than 1, or for example to vary the window size dynamically.

The correlation coefficients $\rho_1(n)$ and $\rho_2(n)$ may be normalised to produce respective normalised correlation coefficients as follows:

$$\tilde{\rho}_1(n) = \frac{\min(\max(\rho_1(n), 0), \gamma)}{\gamma}$$

$$\tilde{\rho}_2(n) = \frac{\min(\max(\rho_2(n), 0), \gamma)}{\gamma}$$

where $\gamma$ is a parameter representing the maximum expected squared force.

These normalised correlation coefficients are bounded between 0 and 1, and may be combined as follows to provide the squeeze force level y(n):

$$y(n) = \min(\tilde{\rho}_1(n) + \tilde{\rho}_2(n), 1)$$

The squeeze detection operation for said group may comprise detecting the user squeeze input based on the squeeze force level signal y(n), for example by comparing the signal with a threshold. It will be appreciated that only one of the correlation coefficients $\rho_1(n)$ and $\rho_2(n)$ (e.g. $\rho_1(n)$) may have been normalised to produce a corresponding normalised correlation coefficient as above, and this value used as the squeeze force level y(n).

Parameter values for the smoothing parameter A and the maximum expected squared force parameter $\gamma$ (and window size w and hardware delay $\Delta$ if used) may differ from application to application, and may be varied dynamically. Of course, one or more of these parameters may be tunable, for example dynamically based on any of the signals s1(n), s2(n), s3(n), s4(n) and y(n) or based on a tuning input, or set for a given application or based on a user input.

The operations described herein are dependent at least to an extent on the arrangement of the force sensors 130 in the device 100, and relate in particular to how the input sensor signals are handled in the controller 110. The skilled person will accordingly recognise that aspects of the operations disclosed herein (and associated methods) may be embodied within the controller 110 itself based on the input sensor signals it receives. As such, the controller 110 itself and the methods it carries out (and corresponding computer programs) may embody the present invention.

Turning back to FIG. 1, the controller 110 may be configured to control operation of the device 100 based on detection of the user squeeze input. For example, the controller 110 may be configured to control operation of itself or of at least one of the input/output components of the I/O unit 140 based on detection of the user squeeze input. In the context of haptic functionality, the controller 110 may be configured to control an LRA within the I/O unit 140 based on detection of the user squeeze input.

As another example, the user squeeze input may be taken to be a user input in connection with a GUI (graphical user interface) displayed on a touchscreen of the device 100. Of course, numerous other examples will occur to the skilled person, the user squeeze input simply serving as a generic user input which may be taken advantage of in any way.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

The invention claimed is:

1. A device, comprising:
   first and second force sensors located on respective different sides or edges of the device from one another, the first and second force sensors being different force sensors from one another, said different sides or edges opposing one another such that when a user applies forces on said different sides or edges of the device at the same time said forces oppose one another and together compress the device, and a user squeeze input comprising the user applying said forces; and a controller configured in a squeeze detection operation to detect the user squeeze input, the squeeze detection operation comprising determining a cross-correlation value of a cross-correlation between a first sensor signal originating from the first force sensor and a second sensor signal originating from the second force sensor and comparing the cross-correlation value with a threshold value.

2. The device as claimed in claim 1, wherein said user squeeze input comprises the user applying said forces with one or both of their hands.

3. The device as claimed in claim 1, wherein said first and second force sensors are provided on the device at locations according to anthropometric measurements of a human hand.

4. The device as claimed in claim 1, wherein determining the cross-correlation value comprises determining a sliding dot product, a cross-product, a product, a sum or a combination of the sensor signals originating from the first and second force sensors.

5. The device as claimed in claim 1, wherein the respective sensor signals originating from the first and second force sensors are digital signals, and the squeeze detection operation comprises determining the cross-correlation value on a sample-by-sample basis.

6. The device as claimed in claim 5, wherein:
for a given sample, the cross-correlation value is generated as an updated cross-correlation value by updating an existing cross-correlation value based on a new cross-correlation value determined based on the sensor signals for that given sample, optionally wherein the updated cross-correlation value is based on the existing cross-correlation value to an extent defined by a smoothing parameter, or is based on a combination or sum of a proportion of the existing cross-correlation value and a proportion of the new cross-correlation value, those proportions defined by the smoothing parameter; and/or
the cross-correlation value is generated as a smoothed or averaged cross-product of the respective sensor signals originating from the first and second force sensors.

7. The device as claimed in claim 1, wherein the squeeze detection operation comprises:
at least one of normalising, filtering and bounding the cross-correlation value; and/or
normalising the cross-correlation value to a maximum expected force value; and/or
converting the cross-correlation value into a percentage or a fraction of a defined maximum value.

8. The device as claimed in claim 7, wherein the squeeze detection operation comprises determining whether the cross-correlation value exceeds the threshold value, optionally wherein the device is configured to control the threshold value based on one or more of a device configuration, a device setting and a user input.

9. The device as claimed in claim 7, wherein the squeeze detection operation comprises determining whether the cross-correlation value exceeds the threshold value for a threshold period of time, or by a threshold percentage of the threshold period of time.

10. The device as claimed in claim 1, comprising a plurality of pairs of force sensors, one of said pairs comprising said first and second force sensors, each pair located for detecting a corresponding user squeeze input, wherein:
the controller is operable, for each said pair of force sensors, to carry out a said squeeze detection operation to detect the corresponding user squeeze input.

11. The device as claimed in claim 1, wherein the first and second force sensors are a pair of force sensors, and wherein at least two said pairs of force sensors are located on the device for detecting the same user squeeze input, wherein:
the controller is operable to detect the user squeeze input corresponding to those pairs of force sensors based on a combination of the squeeze detection operations carried out for those pairs, optionally by combining cross-correlation values determined in respect of each of those pairs.

12. The device as claimed in claim 1, the first and second force sensors being part of a group of force sensors located on the device for detecting a user squeeze input corresponding to that group, wherein:
the squeeze detection operation, for said group, comprises comparing respective sensor signals originating from at least three of the force sensors of the group.

13. The device as claimed in claim 1, said first and second force sensors being part of a group of force sensors located on the device for detecting a user squeeze input corresponding to that group, wherein:
said group comprises force sensors s1, s2, s3 and s4;
the sensor signals originating from the group are digital signals s1(n), s2(n), s3(n) and s4(n) corresponding respectively to the force sensors s1, s2, s3 and s4 and each comprising a series of numbered samples, where n is the sample number; and
the squeeze detection operation for said group comprises calculating correlation coefficients $\rho_1(n)$ and $\rho_2(n)$ based on the equations:

$$\rho_1(n) = \lambda \cdot \rho_1(n-1) + (1-\lambda) \cdot s1(n) \cdot s2(n)$$

$$\rho_2(n) = \lambda \cdot \rho_2(n-1) + (1-\lambda) \cdot s3(n) \cdot s4(n)$$

where $\lambda$ is a smoothing parameter.

14. The device as claimed in claim 13, wherein:
the squeeze detection operation for said group comprises normalising the correlation coefficients $\rho_1(n)$ and $\rho_2(n)$ to produce respective normalised correlation coefficients based on the equations:

$$\tilde{\rho}_1(n) = \frac{\min(\max(\rho_1(n), 0), \gamma)}{\gamma}$$

$$\tilde{\rho}_2(n) = \frac{\min(\max(\rho_2(n), 0), \gamma)}{\gamma}$$

where $\gamma$ is a parameter representing a maximum expected squared force.

15. The device as claimed in claim 14, wherein:
the squeeze detection operation for said group comprises determining a squeeze force level signal y(n) based on the equation:

$$y(n) = \min(\tilde{\rho}_1(n) + \tilde{\rho}_2(n), 1).$$

16. The device as claimed in claim 15, wherein the squeeze detection operation for said group comprises detecting the user squeeze input based on the squeeze force level signal y(n).

17. The device as claimed claim 1, wherein the controller is configured to control operation of the device based on detection of the user squeeze input, optionally by outputting a control signal based on detection of the user squeeze input.

18. A controller for use in a device comprising first and second force sensors located on respective different sides or edges of the device from one another, the first and second force sensors being different force sensors from one another, said different sides or edges opposing one another such that when a user applies forces on said different sides or edges of the device at the same time said forces oppose one another and together compress the device, and a user squeeze input comprising the user applying said forces, the controller configured in a squeeze detection operation to detect the user squeeze input, the squeeze detection operation comprising determining a cross-correlation value of a cross-correlation between a first sensor signal originating from the first force sensor and a second sensor signal originating from the second force sensor and comparing the cross-correlation value with a threshold value.

19. A method of controlling a device, the device comprising first and second force sensors located on respective different sides or edges of the device from one another, the first and second force sensors being different force sensors from one another, said different sides or edges opposing one another such that when a user applies forces on said different sides or edges of the device at the same time said forces oppose one another and together compress the device, and a user squeeze input comprising the user applying said forces, the method comprising:

detecting the user squeeze input in a squeeze detection operation, the squeeze detection operation comprising determining a cross-correlation value of a cross-correlation between a first sensor signal originating from the first force sensor and a second sensor signal originating from the second force sensor and comparing the cross-correlation value with a threshold value.

* * * * *

UNITED STATES PATENT AND TRADEMARK OFFICE
CERTIFICATE OF CORRECTION

| | | |
|---|---|---|
| PATENT NO. | : 11,515,875 B2 | Page 1 of 1 |
| APPLICATION NO. | : 17/192632 | |
| DATED | : November 29, 2022 | |
| INVENTOR(S) | : Peso Parada et al. | |

It is certified that error appears in the above-identified patent and that said Letters Patent is hereby corrected as shown below:

In the Claims

1. In Column 11, Line 52, in Claim 8, delete "value," and insert -- value; --, therefor.

2. In Column 12, Line 13, in Claim 12, delete "a user squeeze input" and insert -- the user squeeze input --, therefor.

3. In Column 12, Line 20, in Claim 13, delete "a user squeeze input" and insert -- the user squeeze input --, therefor.

4. In Column 12, Line 61, in Claim 17, delete "claimed" and insert -- claimed in --, therefor.

Signed and Sealed this
Seventh Day of March, 2023

Katherine Kelly Vidal
*Director of the United States Patent and Trademark Office*